United States Patent
Ishikawa et al.

(10) Patent No.: US 6,929,856 B2
(45) Date of Patent: Aug. 16, 2005

(54) DICING TAPE

(75) Inventors: Seiji Ishikawa, Chiba (JP); Koji Hayashi, Ube (JP); Kenji Sonoyama, Ube (JP)

(73) Assignee: Ube Industries, Ltd. (JP)

( * ) Notice: Subject to any disclaimer, the term of this patent is extended or adjusted under 35 U.S.C. 154(b) by 0 days.

(21) Appl. No.: 10/628,834

(22) Filed: Jul. 28, 2003

(65) Prior Publication Data

US 2004/0023043 A1 Feb. 5, 2004

(30) Foreign Application Priority Data

Jul. 31, 2002 (JP) .................................... 2002-222670

(51) Int. Cl.$^7$ ................................................ B32B 7/12
(52) U.S. Cl. .................... 428/355 RA; 428/355 EP; 428/355 R; 428/447
(58) Field of Search .................... 428/355 N, 355 R, 428/355 RA, 355 EP, 355 AK, 447, 473.5; 526/931; 523/111; 528/26, 28, 38, 431

(56) References Cited

U.S. PATENT DOCUMENTS 5,180,627 A    1/1993   Inoue et al.
6,271,107 B1 * 8/2001  Massingill et al. ......... 438/597
6,335,571 B1 * 1/2002  Capote et al. .............. 257/787

FOREIGN PATENT DOCUMENTS

| JP | 05025452 A | 2/1993 |
| JP | 05025453 A | 2/1993 |
| JP | 10324857 A | 12/1998 |

* cited by examiner

*Primary Examiner*—Thao T. Tran
(74) *Attorney, Agent, or Firm*—DLA Piper Rudnick Gray Cary US LLP

(57) ABSTRACT

Dicing tape comprises a tackifiable adhesive layer which is composed mainly of a polyimide and has a peel strength of 0.02 N/mm (20 gf/cm) or greater as the adhesive strength at near room temperature (20–50° C.) and a cured peel strength of 0.3 N/mm (300 gf/cm) or greater. The tape exhibits adhesive strength with silicon wafers sufficiently high to allow dicing at near room temperature, and also exhibits high adhesive strength with circuit boards after curing, in light of the processing disadvantages of polyimide-based dicing tape resulting from its low tacky strength (initial adhesive strength) at low temperatures of around room temperature, which requires a higher ambient temperature to increase the adhesive force and thus necessitates supplementary heating equipment.

6 Claims, No Drawings

DICING TAPE

BACKGROUND OF THE INVENTION

1. Field of the Invention

The present invention relates to new type dicing tape, comprising polyimide-based dicing tape which can be adhesively attached to a silicon wafer and diced at near room temperature, and can function as an adhesive for laminating diced individual silicon wafers onto circuit boards.

2. Description of Related Art

Conventionally, semiconductor wafers such as silicon wafers are manufactured in large-diameter disc shapes, and then for example, a circuit pattern is formed on the surface thereof, protective tape is attached to one surface to protect the circuit pattern and the back side is then machined for thinning, after which, in order to form semiconductor chips from the machined semiconductor wafer, the semiconductor manufactured in the large-diameter disc shape is adhered to a ring frame via adhesive tape and then cut (diced) into multiple dice-shaped (square) or rectangular chips. The individual cut chips are subsequently separated from the adhesive tape and the separated chips are successively bonded to, for example, the inner leads of device holes on IC mounting boards.

Such adhesive tape is referred to as dicing tape, and for dicing, one surface is laminated by adhesive force onto a large-diameter disc-shaped silicon wafer while a release film is laminated on the back side, while after dicing, the individual silicon wafers are attached to substrates via adhesive tape (dicing tape) which has been cut to the prescribed size, and these are post-processed by wire bonding, mold sealing, solder ball formation or the like to manufacture semiconductor packages.

For example, Japanese Unexamined Patent Publication No. 10-324857 describes adhesive tape for use as dicing tape. However, the adhesive tape described in this publication is composed of an adhesive composition of (meth) acrylic acid copolymer and phenol resin, which is unsuitable for high-density mounting.

Polyimide-based dicing tape has therefore been investigated, but polyimide-based dicing tape has been associated with disadvantages in terms of process steps, because of its low tacky strength (initial adhesive strength) at low temperatures of around room temperature, such that a higher ambient temperature is required to increase the adhesive force which thus necessitates supplementary heating equipment.

BRIEF SUMMARY OF THE INVENTION

It is an object of the present invention to provide dicing tape which exhibits adhesive strength with silicon wafers sufficiently high to allow dicing at near room temperature, and also exhibits high adhesive strength with circuit boards after curing.

The present invention relates to dicing tape comprising a tackifiable adhesive layer which is composed mainly of a polyimide and has a peel strength of 0.02 N/mm (20 gf/cm) or greater as the adhesive strength at near room temperature (20–50° C.) and a cured peel strength of 0.3 N/mm (300 gf/cm) or greater.

DETAILED DESCRIPTION OF THE INVENTION

Preferred embodiments of the invention are listed below.

1) The aforementioned dicing tape wherein the initial peel strength (adhesive strength) is 0.02–1 N/mm (20–1000 gf/cm) or greater and the cured peel strength is 0.3–1.6 N/mm (300–1600 gf/cm).

2) The aforementioned dicing tape wherein the volume resistivity indicating the electrical insulating property is $10^{14}$ Ω·cm or greater.

3) The aforementioned dicing tape wherein the thickness is 5–50 μm.

4) The aforementioned dicing tape wherein the polyimide is a polyimidosiloxane.

5) A dicing method comprising using the aforementioned dicing tape.

The following is an example of packaging steps using dicing tape of the invention (which may sometimes be laminated on the back side with a release material such as a release film and on the front side with a protective film for storage, transport and use).

1. Attachment of circuit-formed silicon wafer to dicing tape with the protective film removed.
2. Dicing to form separate individual IC chips.
3. Release of IC chips from tape. (The tackifiable adhesive layer is evenly transferred to the back sides of the IC chips.)
4. Die bonding to board.
5. Bonding of IC chips and board by heat.
6. Wire bonding.
7. Mold sealing.
8. Solder ball formation.

The dicing tape may have the tackifiable adhesive layer on both sides of the support, with the release material situated on the outer surface.

As tackifiable adhesive agents for the invention there may be mentioned resin compositions obtained by crosslinking a soluble polyimide, preferably a polyimidosiloxane, and a thermosetting resin. The crosslinking may be accomplished by including a curing agent and performing heat setting, or it may be accomplished by using a diamine which is reactive with a thermosetting resin as the diamine component for obtaining the soluble polyimide, to introduce into the soluble polyimide molecules a group which is reactive with the thermosetting resin, and permit crosslinking of both components.

As polyimidosiloxanes there may be mentioned polyimidosiloxanes obtained from tetracarboxylic acid components, particularly tetracarboxylic dianhydrides, and diamine components composed of 10–90 mole percent of a diaminopolysiloxane represented by the general formula (1):

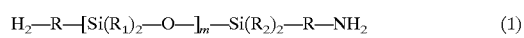

$$H_2-R-[Si(R_1)_2-O-]_m-Si(R_2)_2-R-NH_2 \quad (1)$$

(wherein R represents a plurality of $C_{2-6}$ methylene groups or a divalent hydrocarbon residue comprising a phenylene group, $R_1$ and $R_2$ each represent a $C_{1-5}$ alkyl group or a phenyl group, and m is an integer of 3–60) and 10–90 mole percent of an aromatic diamine (where the diaminopolysiloxane and aromatic diamine total 100 mole percent), and they include so-called imidosiloxane oligomers.

The reaction between the tetracarboxylic dianhydride and the diamine may be conducted by random or block polymerization, or by a two-solution mixture and rebonding reaction in a solvent. One production process which may be mentioned involves reaction at high temperature (most preferably at 140° C. or above) for polymerization or imidation of the two monomer components. The polyimidosiloxane may be used directly without isolation from the solution.

As specific examples of diaminopolysiloxane compounds there may be mentioned α,ω-bis(2-aminoethyl)polydimethylsiloxane, α,ω-bis(3-aminopropyl)polydimethylsiloxane, α,ω-bis(4-aminophenyl)polydimethylsiloxane, α,ω-bis(4-amino-3-methylphenyl)polydimethylsiloxane, α,ω-bis(3-aminopropyl)polydiphenylsiloxane and α,ω-bis(4-aminobutyl)polydimethylsiloxane.

As tetracarboxylic anhydrides there may be mentioned aromatic tetracarboxylic dianhydrides such as 3,3',4,4'-biphenyltetracarboxylic dianhydride, 2,2',3,3'-biphenyltetracarboxylic dianhydride, 2,3,3',4'-biphenyltetracarboxylic dianhydride, 3,3',4,4'benzophenonetetracarboxylic dianhydride, bis(3,4-dicarboxyphenyl)ether dianhydride, pyromellitic dianhydride, 2,3,6,7-naphthalenetetracarboxylic dianhydride, 1,2,5,6-naphthalenetetracarboxylic dianhydride, 1,2,4,5-naphthalenetetracarboxylic dianhydride, 1,4,5,8-naphthalenetetracarboxylic dianhydride and 2,2-bis(2,5-dicarboxyphenyl)propane dianhydride.

As tetracarboxylic dianhydrides with particularly high solubility in solvents and resulting in high heat resistance of the obtained tackifiable adhesive, there are preferred aromatic tetracarboxylic dianhydrides such as 2,3,3',4'-biphenyltetracarboxylic dianhydride, 3,3',4,4'-benzophenonetetracarboxylic dianhydride, bis(3,4-dicarboxyphenyl)ether dianhydride and 1,3-bis(3,4-dicarboxyphenyl)-1,1,3,3-tetramethyldisiloxane dianhydride, with 2,3,3',4'-biphenyltetracarboxylic dianhydride being especially preferred.

As aromatic diamines having functional groups reactive with the thermosetting resin, for example, with the epoxy groups of an epoxy resin, there may be used aromatic diamine compounds represented by the formula:

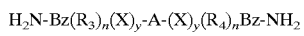

or the formula:

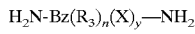

wherein Bz is a benzene ring, $R_3$ and $R_4$ are hydrogen, A is a direct bond or a divalent group such as O, S, CO, $SO_2$, SO, $CH_2$, $C(CH_3)_2$, OBzO, Bz, O, $BzC(CH_3)_2BzO$ or the like, X is a carboxyl group or hydroxyl group, n is 2 or 3 (preferably 3), y is 1 or 2 (preferably 1) and n+y=4.

Preferably two of the aforementioned diamine components are used, but an aromatic diamine with multiple rings and no groups reactive with the thermosetting resin may instead be used. As aromatic diamines with multiple rings there may be mentioned aromatic diamines with 3 benzene rings such as 1,4-bis(4-aminophenoxy)benzene, 1,3-bis(4-aminophenoxy)benzene and 1,4-bis(4-aminophenyl)benzene, or aromatic diamines with 4 benzene rings such as bis[4-(4-aminophenoxy)phenyl]sulfone, 2,2-bis[4-(4-aminophenoxy)phenyl]sulfone and 2,2-bis[4-(4-aminophenoxy)phenyl]propane.

As specific examples of aromatic diamines with functional groups that are reactive with the thermosetting resin, for example, with the epoxy groups of an epoxy resin, there may be mentioned diamine compounds having OH groups, for example, diaminophenol compounds such as 2,4-diaminophenol, hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl and 4,4'-diamino-2,2',5,5'-tetrahydroxybiphenyl, hydroxydiphenylalkane compounds such as 3,3'-diamino-4,4'-dihydroxydiphenylmethane, 4,4'-diamino-3,3'-dihydroxydiphenylmethane, 4,4'-diamino-2,2'-dihydroxydiphenylmethane, 2,2-bis[3-amino-4-hydroxyphenyl]propane, 2,2-bis[4-amino-3-hydroxyphenyl]propane, 2,2-bis[3-amino-4-hydroxyphenyl]hexafluoropropane and 4,4'-diamino-2,2',5,5'-tetrahydroxydiphenylmethane, hydroxydiphenyl ether compounds such as 3,3'-diamino-4,4'-dihydroxydiphenyl ether, 4,4'-diamino-3,3'-dihydroxydiphenyl ether, 4,4'-diamino-2,2'-dihydroxydiphenyl ether and 4,4'-diamino-2,2',5,5'-tetrahydroxydiphenyl ether, bis(hydroxyphenoxyphenyl)alkane compounds such as 2,2-bis[4-(4-amino-3-hydroxyphenoxy)phenyl]propane, and bis(hydroxyphenoxy)biphenyl compounds such as 4,4'-bis(4-amino-3-hydroxyphenoxy)biphenyl.

As additional specific examples of aromatic diamines with functional groups that are reactive with epoxy groups there may be mentioned diamine compounds having COOH groups, for example, carboxybiphenyldiamine compounds such as 3,3'-diamino-4,4'-dicarboxybiphenyl, 4,4'-diamino-3,3'-dicarboxybiphenyl, 4,4'-diamino-2,2'-dicarboxybiphenyl and 4,4'-diamino-2,2',5,5'-tetracarboxybiphenyl, carboxydiphenylalkanediamine compounds such as 3,3'-diamino-4,4'-dicarboxydiphenylmethane, 4,4'-diamino-3,3'-dicarboxydiphenylmethane, 4,4'-diamino-2,2'-dicarboxydiphenylmethane, 2,2-bis[3-amino-4-carboxyphenyl]propane, 2,2-bis[4-amino-3-carboxyphenyl]propane, 2,2-bis[3-amino-4-carboxyphenyl]hexafluoropropane and 4,4'-diamino-2,2',5,5'-tetracarboxybiphenyl, carboxydiphenylether diamine compounds such as 3,3'-diamino-4,4'-dicarboxydiphenyl ether, 4,4'-diamino-3,3'-dicarboxydiphenyl ether, 4,4'-diamino-2,2'-dicarboxydiphenyl ether and 4,4'-diamino-2,2',5,5'-tetracarboxydiphenyl ether, bis(carboxyphenoxyphenyl)alkanediamine compounds such as 2,2-bis[4-(4-amino-3-carboxyphenoxy)phenyl]propane, bis(carboxyphenoxy)biphenyldiamine compounds such as 4,4'-bis(4-amino-3-carboxyphenoxy)biphenyl and diaminobenzoic acids such as 3,5-diaminobenzoic acid and 2,4-diaminobenzoic acid.

As the aforementioned solvent there may be mentioned nitrogen-containing solvents, for example, N,N-dimethylacetamide, N,N-diethylacetamide, N,N-dimethylformamide, N,N-diethylformamide, N-methyl-2-pyrrolidone, 1,3-dimethyl-2-imidazolidinone, N-methylcaprolactam and the like, sulfur-containing solvents, for example, dimethylsulfoxide, diethylsulfoxide, dimethylsulfone, diethylsulfone, hexamethylsulforamide and the like, oxygen-containing solvents, for example, γ-butyrolactone, phenolic solvents, for example, cresol, phenol, xylenol and the like, diglyme-based solvents, for example, diethyleneglycol dimethyl ether (diglyme), triethyleneglycol dimethyl ether (dimethyltriglyme), tetraglyme and the like, as well as acetone, ethylene glycol, dioxane, tetrahydrofuran, and the like.

The soluble polyimide, which is preferably a polyimidosiloxane, is a polymer with an intrinsic viscosity (measuring concentration: 0.5 g/100 milliliter of solvent, solvent: N-methyl-2-pyrrolidone, measuring temperature: 30° C.) of 0.05–7, especially 0.07–4 and more preferably about 0.1–3, and preferably it is able to uniformly dissolve in any organic polar solvent (particularly amide-based solvents) to a concentration of at least 3 wt % and especially about 5–40 wt %.

The polyimidosiloxane has an imidation rate of 90% or greater and especially 95% or greater as measured by infrared absorption spectrometry, and preferably has a high enough imidation rate that it exhibits essentially no absorption peak due to amic acid bonds of the polymer in infrared absorption spectrometry, and exhibits only absorption peaks for the imide ring bonds.

When the polyimidesiloxane is formed into a film, the elastic modulus is no greater than 250 kg/mm$^2$, especially about 0.1–200 kg/mm$^2$ and preferably 0.5–150 kg/mm$^2$, the thermal decomposition initiation temperature is 250° C. or higher and especially 300° C. or higher, and the secondary transition temperature is −10° C. or higher and most preferably about 5–250° C.

A thermosetting resin is preferably used together with the polyimidesiloxane in the tackifiable adhesive agent.

For optimal performance in terms of satisfactory adhesion, post-curing adhesiveness and heat resistance, there are preferred resin compositions comprising at least one type of thermosetting resin selected from the group consisting of epoxy resins, epoxy-modified polysiloxanes, bismaleimide-triazine based resins, bismaleimide resins and (iso)cyanate compound based resins as thermosetting resins at 1–100 parts by weight (especially 5–50 parts by weight) with respect to 100 parts by weight of the soluble polyimide, with a curing agent (preferably at 0–100 parts by weight and especially 0–20 parts by weight) as resin components.

As epoxy resins there may be mentioned epoxy resins composed of epoxy compounds with one or more epoxy groups, such as o-cresol-novolac epoxy resins, phenol-novolac epoxy resins, bisphenol A epoxy resins, bisphenol F epoxy resins, glycidyl ether epoxy resins, glycidyl ester epoxy resins, glycidylamine epoxy resins and the like, and these various epoxy resins may also be used in combination.

As specific examples of such epoxy resins there may be mentioned bisphenol A or bisphenol F epoxy resins (trade name: EPIKOTE 807, 828, etc. by Yuka Shell Epoxy Co., Ltd.), phenol-novolac epoxy resins and alkyl polyhydric phenol epoxy resins (RE701, RE550S, etc. by Nihon Kayaku Co., Ltd.), polyfunctional epoxy resins (ELM-100, etc. by Sumitomo Chemical Industries Co., Ltd.), or glycidyl ether epoxy resins and glycidyl ester epoxy resins and glycidylamine epoxy resins (trade name: TETRAD X, etc. by Mitsubishi Gas & Chemical Co., Ltd.). These resins may be used alone or in combinations of two or more.

Epoxy-modified polysiloxanes include those obtained by reacting a reactive polysiloxane oil having a terminal hydroxyl, carboxyl or amino group with an epoxy compound such as a bisphenol epoxy resin, phenol-novolac epoxy resin, glycidyl ether epoxy resin, glycidyl ester epoxy resin or the like. It is sufficient for the epoxy-modified polysiloxane to have at least one epoxy group at the end or interior of the polysiloxane.

The epoxy-modified polysiloxane is preferably an epoxy/polyoxyalkylene-modified polysiloxane having at least one epoxy group at the end or in the middle portion of the polysiloxane. As examples of specific epoxy-modified polysiloxanes there may be mentioned epoxy-modified polysiloxanes (BY-16-855D by Toray/Dow Corning Co., Ltd.; X-22-163A, X-22-163B by Shinetsu Silicone Co., Ltd.) and epoxy/polyoxyalkylene-modified polysiloxanes (SF-8421EG, BY-16-845, BY-16-867, etc. by Toray/Dow Corning Co., Ltd.).

As other thermosetting resins there may be mentioned bismaleimide-triazine resins, and for example, there may be mentioned as preferable bismaleimide-triazine resins obtained from a bismaleimide component and a cyanate group-containing triazine monomer or prepolymer component, which are publicly known thermosetting resin compositions having an imide group and a triazine ring, and which may be optionally modified with 0–30 wt % of an acrylic acid ester, divinylbenzene, styrene, triallyl isocyanate or the like, and particularly there may be mentioned "BT RESIN" by Mitsubishi Gas & Chemical Co., Ltd.

As other thermosetting resins there may be mentioned bismaleimide resins having maleic acid-based unsaturated (double bond) groups at both ends, which are obtained by condensation of, for example, maleic anhydride and a diamine compound, and an example thereof is "ATU-BMI RESIN" by Ajinomoto Co., Ltd. As preferred diamine compounds there may be mentioned aromatic diamine compounds such as diaminobenzene, 4,4'-diamino-3,3'-dimethylbiphenyl, 4,4'-diaminodiphenyl ether and 4,4'-diaminodiphenylmethane and 2,2-bis(4-aminophenyl) propane.

(Iso)cyanate compound-based resins may be mentioned as alternative thermosetting resins.

Examples thereof include cyanate compounds, such as bisphenol A dicyanate, bis(4-cyanatephenyl)ether, 1,1,1-tris (4-cyanatephenyl)ethane and the like, and particularly there may be mentioned "XU-71787-02" by The Dow Chemical Co.

There may be also be mentioned isocyanates, among which any may be used having two or more isocyanate groups in the molecule. Examples of such polyvalent isocyanates include aliphatic, alicyclic and aromatic diisocyanates, and as specific examples there may be mentioned 1,4-tetramethylene diisocyanate, 1,5-pentamethylene diisocyanate, 1,6-hexamethylene diisocyanate, 2,2,4-trimethyl-1,6-hexamethylene diisocyanate, lysine diisocyanate, 3-isocyanatemethyl-3,5,5-trimethylcyclohexyl isocyanate (isophorone diisocyanate), 1,3-bis (isocyanatemethyl)cyclohexane, 4,4'-dicyclohexylmethane diisocyanate tolylene diisocyanate, 4,4'-diphenylmethane diisocyanate, 1,5-naphthalene diisocyanate, tolidine diisocyanate and xylylene diisocyanate.

The aforementioned polyvalent diisocyanates may be derived from aliphatic, alicyclic or aromatic polyvalent isocyanates, such as isocyanurate-modified polyvalent isocyanates, burette-modified polyvalent isocyanates and urethane-modified polyvalent isocyanates. A polyvalent isocyanate used for the invention is preferably a block polyvalent isocyanate having the isocyanate groups of the polyvalent isocyanate blocked with a blocking agent.

Examples of blocking agents include alcohol, phenol, active methylene, mercaptane, acid amide, acid imide, imidazole, urea, oxime, amine, imide and pyridine-based compounds, any of which may be used alone or in combinations of two or more.

The tackifiable adhesive agent used in the invention may also be used with a thermosetting resin (particularly epoxy resin) curing agent, and if necessary a curing accelerator. As specific examples of curing agents there may be mentioned phenols such as phenol-novolac, o-cresol-novolac and phenol-resol, amines such as 2-ethyl--4-methylimidazole and diethylenetriamine, and acid anhydrides such as phthalic anhydride.

As types of curing agents there may be mentioned publicly known curing agents, for example, curing catalysts such as imidazoles, tertiary amines and triphenylphosphines, polyaddition curing agents such as dicyandiamides, hydrazines, aromatic diamines, and hydroxyl group-containing phenol-novolac curing agents (phenol-novolac: H-1, H-5, etc. by Meiwa Kasei Co., Ltd.), organic peroxides, and the like. The curing agent may also be used together with a suitable publicly known curing accelerator.

The amount of curing agent used is generally preferred to be 0–100 parts by weight to 100 parts by weight of the epoxy compound.

The dicing tape of the invention may be obtained, for example, by coating a solution composition comprising the aforementioned tackifiable adhesive composition onto a base which may be a release film such as an untreated polyimide film or releasable polyester film to a thickness of 10–500 μm and drying it at a temperature of 90–150° C. for 30–40 minutes to form a tackifiable adhesive layer with a thickness of 5–50 μm which maintains its tacky property, and then in cases where dust adhesion must be prevented, laminating a protective film thereover.

The dicing tape of the invention can be attached onto a silicon wafer. The bonding force may be 0.02 N/mm or greater, preferably 0.02–1 N/mm.

The dicing tape of the invention can be attached to a silicon wafer preferably at 20–50° C. and 50 gf/cm$^2$ to 30 kgf/cm$^2$ for 1 sec. to 30 min. Then, the silicon wafer may be diced at a temperature of 20–50° C. Then, the diced individual silicon wafers may be laminated at 120–200° C. and 50 gf/cm$^2$ to 30 kgf/cm$^2$ for 1 sec. to 60 min.

The present invention will now be explained in greater detail through examples.

In the following examples, the values for intrinsic viscosity (η) were calculated after uniformly dissolving the polyimidesiloxane in N-methyl-2-pyrrolidone to a resin component concentration of 0.5 g/100 ml of solvent to prepare a resin solution, and then measuring the solution viscosity of the solution and the solution viscosity of the solvent alone at 30° C.

The peel strength of the dicing tape was measured by a 180° peel test at a peel rate of 50 mm/min and a measuring temperature of 25° C., using a tensile tester (Intesco Co.) with a sample of the laminate (cut to a 1 cm width) contact bonded to a silicon wafer or copper foil.

The insulation resistance was determined by measuring the volume resistivity according to ASTM D149, using a 50 μm wide sample prepared by curing the adhesive sheet at 90° C. for 10 minutes and at 180° C. for 60 minutes.

REFERENCE EXAMPLE 1

In a glass flask equipped with a thermometer, inlets and outlets and a stirrer there were added 67 moles of ω,ω'-bis (3-aminopropyl)polydimethylsiloxane (DAPSi) [m=9 in formula (1) above], 30 moles of 2,2-bis[4-(4-aminophenoxy) phenyl]propane (BAPP), 3 moles of 3,3'-dicarboxy-4,4'-diaminodiphenylmethane (MBAA) and N-methyl-2-pyrrolidone as the reaction solvent to 100 moles of 2,3,3', 4'-biphenyltetracarboxylic dianhydride (a-BPDA), the temperature was raised to 50° C. under a nitrogen stream, the mixture was stirred for 2 hours at that temperature to produce a polyamic acid, and then the reaction solution was heated to approximately 200° C. and the mixture was stirred at that temperature for 5 hours to produce a polyimidesiloxane. Upon completion of the reaction, the reaction solution was poured into a methanol/water mixed solvent as a poor solvent to precipitate the polymer. After then rinsing it with the methanol/water mixed solvent, it was dried at 200° C. The polyimidesiloxane had an imidation rate of at least 95% and an intrinsic viscosity of 0.3.

EXAMPLE 1

After charging 7 g of the above-mentioned polyimidesiloxane, 2 g of BT resin (BT-2170 by Mitsubishi Gas & Chemical Co., Ltd.), 1 g of an epoxy-modified polysiloxane (BY16-855D by Toray/Dow Corning Co., Ltd.) and 33 g of dimethylformamide into a vessel, the mixture was blended for 50 hours.

The mixture was then coated onto a 50 μm polyimide film (UPILEX S by Ube Industries, Ltd.) to approximately 10 μm thickness using an applicator. It was then dried at 90° C. for 30 minutes to obtain dicing tape.

The cured layer of the dicing tape had a volume resistivity of at least $10^{14}$ Ω·cm.

When the obtained dicing tape was attached onto a silicon wafer, the bonding force was 950 gf/cm.

Separately, the dicing tape was laminated onto an 18 μm electrolytic copper foil (mirror surface) using a laminator at 50° C., 0.3 m/min. This was thermocompression bonded at 160° C., 20 kgf/cm$^2$ for 1 hour.

The adhesive force prior to curing was 140 gf/cm, and the adhesive force after curing was 1520 gf/cm.

EXAMPLE 2

Dicing tape was obtained in the same manner as Example 1, except that the proportions of the components were changed to 7 g of the polyimidesiloxane, 2 g of BT resin (BT-2170 by Mitsubishi Gas & Chemical Co., Ltd.), 1.5 g of the epoxy-modified polysiloxane (BY16-855D by Toray/Dow Corning Co., Ltd.) and 33 g of dimethylformamide.

The cured layer of the dicing tape had a volume resistivity of at least $10^{14}$ Ω·cm.

When the obtained dicing tape was attached onto a silicon wafer, the bonding force was 560 gf/cm.

Separately, the dicing tape was laminated onto an 18 μm electrolytic copper foil (mirror surface) using a laminator at 50° C., 0.3 m/min. This was thermocompression bonded at 160° C., 20 kgf/cm$^2$ for 1 hour.

The adhesive force prior to curing was 500 gf/cm, and the adhesive force after curing was 550 gf/cm.

EXAMPLE 3

Dicing tape was obtained in the same manner as Example 1, except that the proportions of the components were changed to 7 g of the polyimidesiloxane, 1 g of BT resin (BT-2170 by Mitsubishi Gas & Chemical Co., Ltd.), 2 g of a curing agent (YP-90LL by Sasuhara Chemical Co. Ltd.) and 36 g of dimethylformamide.

The cured layer of the dicing tape had a volume resistivity of at least $10^{14}$ Ω·cm.

When the obtained dicing tape was attached onto a silicon wafer, the bonding force was 300 gf/cm.

Separately, the dicing tape was laminated onto an 18 μm electrolytic copper foil (mirror surface) using a laminator at 50° C., 0.3 m/min. This was thermocompression bonded at 160° C., 20 kgf/cm$^2$ for 1 hour.

The adhesive force prior to curing was 70 gf/cm, and the adhesive force after curing was 470 gf/cm.

According to the present invention it is possible to obtain dicing tape which exhibits adhesive strength as high as a tackifiable adhesive in an uncured state, and also exhibits high adhesive strength with circuit boards after curing.

What is claimed is:

1. Dicing tape comprising a tackifiable adhesive layer which is composed mainly of a soluble polyimide and an epoxy-modified polysiloxane at 1–100 parts by weight with respect to 100 parts by weight of the soluble polyimide, formed on a release film and has a peel strength of 0.02 N/mm or greater as the adhesive strength at a room temperature of 20–50° C. and a cured peel strength of 0.3 N/mm or greater.

2. The dicing tape according to claim 1, wherein the peel strength is 0.02–1 N/mm and the cured peel strength is 0.3–1.6 N/mm.

3. The dicing tape according to claim 1, wherein the volume resistivity indicating the electrical insulating property of the cured tackifiable adhesive layer is $10^{14}$ Ω·cm or greater.

4. The dicing tape according to claim 1, wherein the thickness of the cured tackifiable adhesive layer is 5–50 μm.

5. The dicing tape according to claim 1, wherein the polyimide is a polyimidesiloxane.

6. The dicing tape according to claim 1, which is used as a bonding sheet after dicing.

* * * * *